United States Patent
Rose et al.

(10) Patent No.: US 7,049,805 B2
(45) Date of Patent: May 23, 2006

(54) RADIO FREQUENCY POWER MEASUREMENT

(75) Inventors: Ian Michael Rose, Maidenhead (GB); Nigel Kenneth Webb, Henley-on-Thames (GB); Christopher John Ward, Charvil (GB)

(73) Assignee: Racal Instruments Wireless Solutions Limited, Slough (GB)

( * ) Notice: Subject to any disclaimer, the term of this patent is extended or adjusted under 35 U.S.C. 154(b) by 0 days.

(21) Appl. No.: 10/504,680

(22) PCT Filed: Feb. 18, 2003

(86) PCT No.: PCT/GB03/00705

§ 371 (c)(1), (2), (4) Date: Apr. 22, 2005

(87) PCT Pub. No.: WO03/071292

PCT Pub. Date: Aug. 28, 2003

(65) Prior Publication Data

US 2005/0174101 A1 Aug. 11, 2005

(30) Foreign Application Priority Data

Feb. 20, 2002  (GB) ................................ 0204012.9

(51) Int. Cl.
*G01R 23/00* (2006.01)
*G01R 19/00* (2006.01)
(52) U.S. Cl. .................. 324/95; 324/76.14; 324/76.11
(58) Field of Classification Search ..................... None
See application file for complete search history.

(56) References Cited

U.S. PATENT DOCUMENTS

| | | | | |
|---|---|---|---|---|
| 3,755,735 | A * | 8/1973 | Biagi et al. | 324/95 |
| 4,104,587 | A * | 8/1978 | Singer et al. | 324/95 |
| 4,758,775 | A * | 7/1988 | Roos | 324/642 |
| 4,791,380 | A * | 12/1988 | Chiappetta | 329/352 |
| 4,922,132 | A * | 5/1990 | Horvitz et al. | 327/73 |
| 5,303,262 | A * | 4/1994 | Johnson | 375/224 |
| 5,373,237 | A | 12/1994 | Imperato | |
| 5,831,538 | A * | 11/1998 | Schena | 340/635 |
| 6,147,481 | A | 11/2000 | Mazzochette et al. | |
| 6,268,735 | B1 | 7/2001 | Craig et al. | |
| 6,313,644 | B1 | 11/2001 | Kim et al. | |
| 6,480,152 | B1 * | 11/2002 | Lin et al. | 342/357.14 |
| 6,690,922 | B1 * | 2/2004 | Lindemann | 455/69 |

FOREIGN PATENT DOCUMENTS

| | | |
|---|---|---|
| EP | 104 748 | 4/1984 |
| EP | 1 037 060 | 9/2000 |
| GB | 2 209 841 | 5/1989 |

* cited by examiner

Primary Examiner—Paresh Patel
(74) Attorney, Agent, or Firm—Leydig, Voit & Mayer, Ltd.

(57) ABSTRACT

An unknown RF power is converted to a voltage by a detector (11). The voltage is converted to a number by a digitiser (12). A separate and fixed RF power reference (14) drives a second detector (15), whose voltage output is also converted to a number by the digitiser (12). The RF detectors are thermally coupled. Temperature variations in the RF power to voltage characteristic of the detector (11) are corrected by measuring the RF power reference (14) via the detector (15).

8 Claims, 2 Drawing Sheets

RADIO FREQUENCY POWER MEASUREMENT

FIELD OF THE INVENTION

This invention relates to the measurement of radio frequency (RF) power.

BACKGROUND

FIG. 1 of the accompanying drawings is a block diagram showing a known technique for measuring RF power.

The unknown RF power to be measured is applied to a detector 1, which converts the RF power into a more easily measurable quantity, such as voltage or temperature (which may in turn be converted to voltage). The voltage representing the RF power is digitised by a digitiser 2. To provide a reading of RF power to the user of the equipment, the output of the digitiser is usually scaled by a numeric correction function in numeric correction block 3, which takes into account the transfer function of the detector, and any fixed offsets which would otherwise give errors at low RF powers.

In a practical implementation of the technique described, the detector block is typically a diode followed by a capacitor. The transfer function of this block, expressed as voltage out divided by RF power in, is a function of frequency, temperature, level and the batch characteristics of the diode. To avoid the user of the equipment having to take these factors into account each time a measurement is made, the detector and digitiser are characterised at initial manufacture using known RF input powers, and the results are retained in the stored numbers block 8. When the user makes a measurement of an unknown RF power, the stored numbers are used by the numeric correction block 3 to scale the output of the digitiser 2, and hence give a corrected measurement.

The process of characterisation at initial manufacture using known RF input powers is called calibration. FIG. 2 of the accompanying drawings is a block diagram showing a known technique for calibration. For simplicity, it will be assumed that the detector is used in a region where the voltage output is proportional to the power input, and that there are no offset errors.

A known RF calibration power $RF_{calpower}$ produced in power source 9 is applied to the detector 1 at a series of known frequencies Fn covering the range of interest. At each frequency the output of the digitiser gives a value $N_{1Fn}$, which can be used together with the known RF calibration power to give the transfer function $T_{1Fn}$ of the detector 1 and digitiser 2 at each frequency Fn:

$$T_{1Fn} = \frac{N_{1Fn}}{RF_{calpower}}$$

This series of numbers $T_{1Fn}$ is retained in the stored numbers block 8.

Referring again to FIG. 1, when the user makes a measurement of an unknown RF power, provided the frequency is known the appropriate stored number can be used by the numeric correction block 3 to scale the output from the digitiser 2, and hence give a reading of the unknown RF power.

This technique takes into account the variability of transfer function with frequency and with the batch characteristics of the diode. It does not however taken into account the variability of transfer function with temperature. If a measurement of an unknown RF power is made at a different temperature from the temperature at the time of calibration, significant errors result.

SUMMARY OF THE INVENTION

It is an object of the present invention to provide a RF power measurement system which at least alleviates the foregoing problem.

According to the present invention the variability in RF power reading with temperature is significantly reduced by providing a second detector driven by a constant RF power source. In effect, variations in the characteristic of the first detector with temperature can be compensated for by observing variations in the characteristic of the second detector.

According to one aspect of the invention there is provided a RF power measurement system comprising, a first detector for converting RF power to be measured to a first measurement signal, a reference source of RF power, a second detector, thermally coupled to said first detector, for converting RF power produced by said reference source to a second measurement signal, and processing means for numerically applying a predetermined correction factor to said first and second measurement signals obtained at the same temperature to derive a value of said RF power to be measured.

According to another aspect of the invention there is provided a method of measuring RF power comprising the steps of using a first detector to convert RF power to be measured to a first measurement signal, using a second detector, thermally coupled to said first detector, to convert RF power produced by a reference source to a second measurement signal, and processing said first and second measurement signals obtained at the same temperature by numerically applying a predetermined correction factor to said first and second measurement signals to derive a value of said RF power to be measured.

BRIEF DESCRIPTION OF DRAWING FIGURES.

An embodiment of the invention will now be described by way of example, with reference to the accompanying drawings in which.

DETAILED DESCRIPTION

Figure 1:
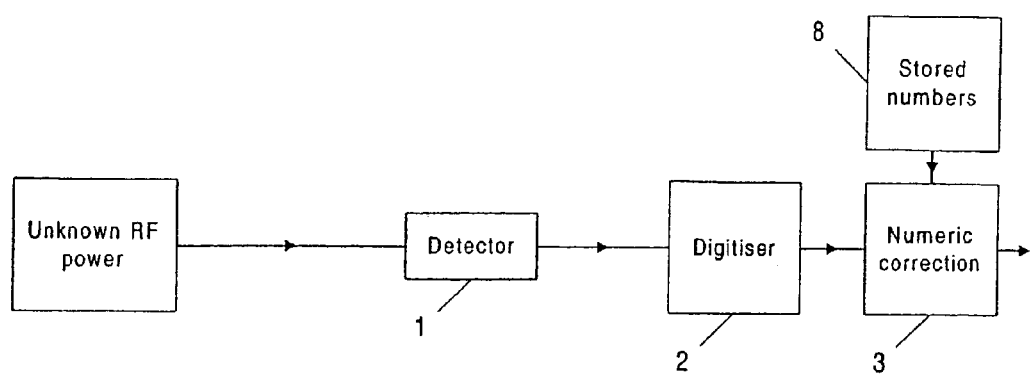
FIG. 1 is a block diagram showing a known technique for measuring RF power.
Figure 2:
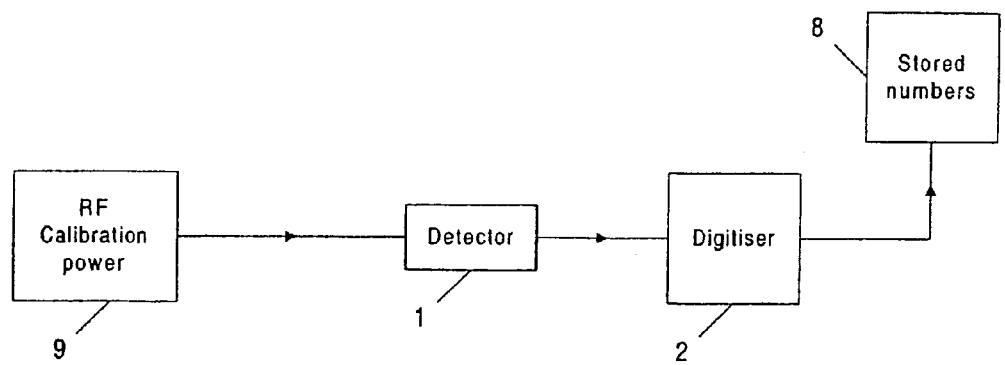
FIG. 2 is a block diagram showing a known technique for calibration.
Figure 3:
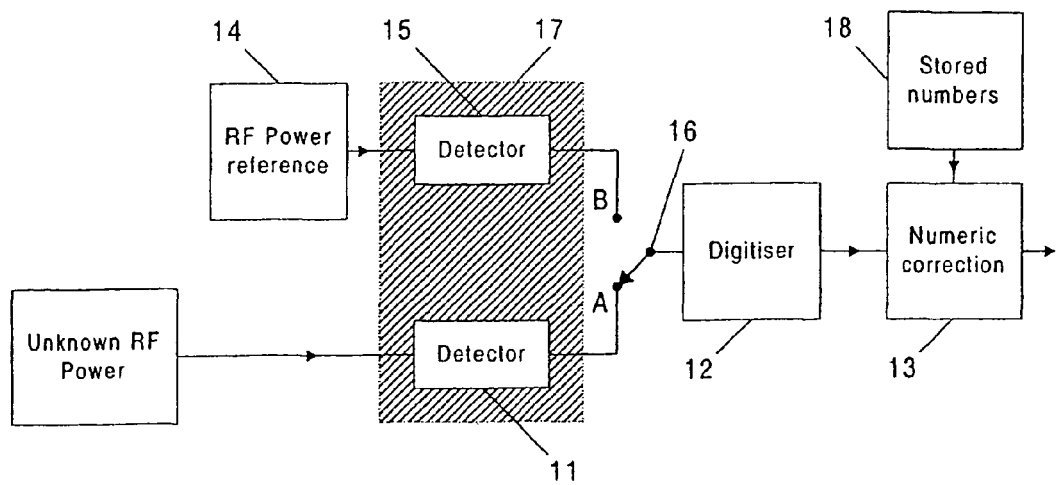
FIG. 3 is a block diagram showing an RF power measurement system according to the invention.

Referring to FIG. 3, the unknown RF power to be measured is supplied to a first detector 11. With a switch 16 in position A, a digitiser 12 gives a numeric output $N_{11meas}$ corresponding to the voltage output from the detector 11, which is then scaled in a numeric correction block 13 to give the result. This part of the system is similar to the known RF power measurement system shown in FIG. 1.

Referring again to FIG. 3, a RF power reference 14 is an oscillator with a well-defined output level and low harmonic content. This may be provided, for example, by an oscillator followed by a divider circuit to give a 50% duty cycle, which in turn switches a well defined current on and off into a fixed load resistor. Harmonics from the resulting squarewave output can be removed by a bandpass filter centred on the output frequency of the oscillator. With suitable selection of components and choice of operating frequency, the output level can be made almost independent of temperature. In practice the operating frequency is usually chosen to be a low, fixed frequency to give the best stability.

The output of the RF power reference 14 is connected to a second detector 15, whose characteristics are well matched to those of the first detector 11. To ensure that the characteristics of detectors 11 and 15 remain well matched over a range of temperatures, they are thermally coupled to each other, for example by each being thermally coupled to a common piece of metal 17. If the temperature of detector 11 increases, the temperature of detector 15 also increases by the same amount. In addition, both detectors are taken from the same manufactured batch.

With the switch 16 set to position B, the digitiser can measure the output from the detector 15 instead of the output from detector 11, giving a corresponding numeric output $N_{15meas}$.

Figure 4:
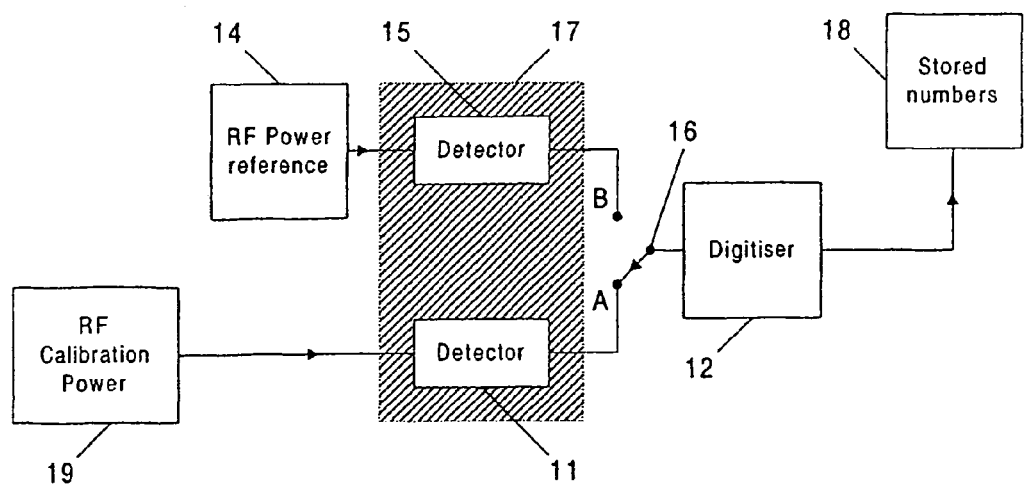
FIG. 4 illustrates a calibration procedure used prior to measuring an unknown RF power.

FIG. 4 shows the calibration procedure, which is performed at a fixed temperature usually during manufacture. A known RF calibration power 19 is connected to the detector 11 at a series of known frequencies Fn covering the range of interest. The switch 16 is set to position A, and at each frequency the output of the digitiser 12 gives a value $N_{11Fncal}$, which can be used together with the known RF calibration power to give the transfer function $T_{11Fn}$ of the detector 11 and digitiser 12 at the frequency Fn:

$$T_{11Fn} = \frac{N_{11Fncal}}{RF_{calpower}} \qquad \text{Eq 1}$$

This series of numbers $T_{11Fn}$ is retained in a stored number block 18.

Maintaining the same temperature conditions, the switch 16 is then set to position B.

The RF power reference 14 is measured via the detector 15, giving an output from the digitiser 12 which is recorded as $N_{15cal}$. Since the reference is at fixed frequency, only one value of $N_{15}$ need be retained in the stored numbers block 18.

Referring again to FIG. 3, the procedure for measuring an unknown power is described. The unknown RF power to be measured is connected to the detector 11, with the switch 16 set to position A. The reading from the digitiser 12 is recorded as $N_{11meas}$. The switch 16 is then set to position B, and the RF power reference 14 is measured via the detector 15, giving an output from the digitiser 12 which is recorded as $N_{15meas}$.

The value of the unknown RF power can be calculated using the previously stored transfer function $T_{11Fn}$. However, the detector transfer function varies with temperature, so the transfer function at the temperature of measurement will be modified from the transfer function at calibration by a temperature factor $F_{temp}$:

$$\text{Unknown } RF \text{ power} = \frac{N_{11meas}}{T_{11Fn} F_{temp}} \qquad \text{Eq 2}$$

If the two detectors 11 and 15 are well matched, the transfer function of the detector 15 will have changed in the same way as the transfer function of the detector 11. The factor $F_{temp}$ can be obtained by taking the ratio of the measured and calibration readings of detector 15:

$$F_{temp} = \frac{N_{15meas}}{N_{15cal}} \qquad \text{Eq 3}$$

Substituting for Eq 3 in Eq 2, the unknown RF power is given by the expression:

$$\text{Unknown } RF \text{ power} = \frac{N_{11meas} N_{15cal}}{T_{11Fn} N_{15meas}} \qquad \text{Correction equation}$$

By means of the correction equation above, the numeric block 13 calculates the unknown RF power using the measured values $N_{11meas}$ and $N_{15meas}$ together with $T_{11Fn}$ and $N_{15cal}$ from the stored numbers block 18. Although the calibration has been performed at only one temperature, the measurement may be performed at other temperatures with only a small loss in accuracy.

In an alternative implementation, the switch 16 may be omitted, and the detector 15 may drive a separate digitiser.

The invention claimed is:

1. A RF power measurement system comprising,
   a first detector for converting RF power to be measured to a first measurement signal,
   a reference source of RF power,
   a second detector, thermally coupled to said first detector, for converting RF power produced by said reference source to a second measurement signal, and
   processing means for numerically applying a predetermined correction factor to said first and second measurement signals obtained at the same temperature to derive a value of said RF power to be measured.

2. A RF power measurement system as claimed in claim 1 wherein said predetermined correction factor is related to a predetermined transfer function of said first detector and being stored in a memory of said processing means.

3. A RF power measurement system as claimed in claim 2 wherein said predetermined correction factor is proportional to a ratio of said first and second measurement signals obtained by a calibration process using an RF calibration source in place of RF power to be measured.

4. A RF power measurement system as claimed in claim 2 wherein said processing means includes a digitiser and said predetermined correction factor is related to a said predetermined transfer function of said first detector and said digitiser.

5. A RF power measurement system as claimed in claim 4 wherein said processing means includes switching means for selectively connecting said digitiser to the output of said first detector and said second detector.

6. A method for measuring RF power comprising the steps of:
   using a first detector to convert RF power to be measured to a first measurement signal;
   using a second detector, thermally coupled to said first detector, to convert RF power produced by a reference source to a second measurement signal,
   and processing said first and second measurement signals obtained at the same temperature by numerically applying a predetermined correction factor to said first and second measurement signals to derive a value of said RF power to be measured.

7. A method as claimed in claim 6 wherein said predetermined correction factor is related to a predetermined transfer function of said first detector and being pre-stored in a memory.

8. A method as claimed in claim 7 wherein said predetermined correction factor is proportional to a ratio of said first and second measurement signals obtained by a calibration process using an RF calibration source in place of RF power to be measured.

* * * * *